United States Patent
Nakamura et al.

(10) Patent No.: US 9,304,161 B2
(45) Date of Patent: Apr. 5, 2016

(54) SOLAR POWER GENERATION SYSTEM, ABNORMALITY DETECTION METHOD, AND ABNORMALITY DETECTION SYSTEM

(75) Inventors: Akihiro Nakamura, Tokyo (JP); Tohru Kohno, Tokyo (JP); Tomoharu Nakamura, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 258 days.

(21) Appl. No.: 13/980,519

(22) PCT Filed: Jan. 25, 2012

(86) PCT No.: PCT/JP2012/000441
§ 371 (c)(1),
(2), (4) Date: Jul. 18, 2013

(87) PCT Pub. No.: WO2012/102028
PCT Pub. Date: Aug. 2, 2012

(65) Prior Publication Data
US 2013/0300449 A1    Nov. 14, 2013

(30) Foreign Application Priority Data

Jan. 27, 2011  (JP) .................................. 2011-014700

(51) Int. Cl.
*G01R 31/26* (2014.01)
*H01L 31/02* (2006.01)
*H02S 50/10* (2014.01)

(52) U.S. Cl.
CPC ...... *G01R 31/2605* (2013.01); *H01L 31/02021* (2013.01); *H02S 50/10* (2014.12); *Y02E 10/50* (2013.01)

(58) Field of Classification Search
None
See application file for complete search history.

(56) References Cited

U.S. PATENT DOCUMENTS

2009/0000659 A1    1/2009    Hasegawa et al.

FOREIGN PATENT DOCUMENTS

| GB | 2158621 B | * | 8/1987 | ............... G05F 1/67 |
|----|-----------|---|--------|---------------------------|
| JP | 2005-340464 A |   | 12/2005 | |
| JP | 2007-311487 A |   | 11/2007 | |
| JP | 2008-91807 A  |   | 4/2008  | |
| JP | 2010-123880 A |   | 6/2010  | |
| KR | 2002085185 A | * | 11/2002 | ............ H01M 10/48 |
| WO | WO 2007/132616 A1 |   | 11/2007 | |

OTHER PUBLICATIONS

Corresponding International Search Report with English Translation dated Mar. 27, 2012 (five (5) pages.

* cited by examiner

*Primary Examiner* — Paresh Patel
(74) *Attorney, Agent, or Firm* — Crowell & Moring LLP

(57) ABSTRACT

In order to provide a system which detects and classifies abnormality in a solar battery even during power generation, an output voltage and an output current of the solar battery during power generation are detected, and a solar battery characteristic equation and a threshold value for detecting an abnormal state are calculated using the detected voltage value and current value and the measurement data of an external environment measurement unit. The kind of abnormal state of the solar battery is classified using the calculation result of the characteristic equation and the threshold value.

1 Claim, 15 Drawing Sheets

SOLAR POWER GENERATION SYSTEM, ABNORMALITY DETECTION METHOD, AND ABNORMALITY DETECTION SYSTEM

TECHNICAL FIELD

The present invention relates to a solar power generation system, and more particularly, to a technique for detecting abnormality in a solar battery.

BACKGROUND ART

PTL 1 discloses an abnormality detection system using the relative comparison of power as an example of a solar battery abnormality detection system according to the related art.

In PTL 1, a sensor is connected in series between a plurality of solar battery arrays and a circuit which is called a power conditioner (PCS) and controls the output power of a solar battery and power generated by the solar battery is input to a solar battery array diagnosis device. The solar battery array diagnosis device measures the maximum power of each solar battery array for a plurality of days and creates a reference value. Power generated after the reference value is created is normalized by the reference value and is converted into weather information, such as sunny or cloudy. The weather information is compared in time series for each array and abnormality in the solar battery is detected on the basis of the comparison result. For example, when the solar battery operates without abnormality, the weather prediction results are identical to each other for all arrays. However, when abnormality occurs, the weather information items are not identical to each other in the comparison.

PTL 2 discloses a system capable of classifying the kinds of failure. First, a solar battery module which is presumed to be defective is separated from the power generation system and is connected to a failure detection system. The failure detection system operates a variable load in order to change the output voltage of the solar battery module from '0 V to an open voltage' and performs curve tracing (measures the current-voltage characteristics). The measured current-voltage characteristics are converted into standard condition data, such as 25° C. and 1 kW/m², on the basis of measurement information, such as the amount of solar radiation or the temperature, during the measurement of the solar battery.

In the system disclosed in PTL 2, the current-voltage characteristics when a plurality of failures occur are stored as reference characteristics in a memory in advance and the reference characteristics closest to the measured current-voltage characteristics are selected by, for example, a least-square method. Then, the kind of failure corresponding to the selected current-voltage characteristics is displayed on an LCD.

CITATION LIST

Patent Literature

PTL 1: JP-A-2005-340464
PTL 2: JP-A-2007-311487

SUMMARY OF INVENTION

Technical Problem

In the abnormality detection system disclosed in PTL 1, the output power levels (weather information) of the plurality of solar battery arrays connected to the PCS are relatively compared to detect abnormality. However, when it is detected whether abnormality occurs, the kind of abnormality is not classified in detail. There are some kinds of failures in the solar battery and there are a case in which the solar battery needs to be rapidly replaced and a case in which the solar battery does not need to be rapidly replaced. In the system disclosed in PTL 1, it is not possible to classify the kinds of failures in detail and thus it becomes difficult to perform appropriate maintenance.

In the failure detection system disclosed in PTL 2, the kinds of failures are classified. However, the solar battery module needs to be separated from the power generation system in order to measure the current-voltage characteristics. Therefore, it is difficult to specify the content of the failure during power generation.

The above-mentioned problems of the related art have been examined and the invention has been made in order to solve the problems.

An object of the invention is to provide an abnormality detection system capable of detecting and classifying abnormality even during power generation.

Solution to Problem

A representative embodiment among the embodiments of the invention will be described briefly as follows.

A solar power generation system includes a solar battery including solar battery cells which are connected in series to each other, a voltage detection unit that detects an output voltage value of the solar battery during power generation, a current detection unit that detects an output current value of the solar battery during the power generation, an external environment measurement unit that acquires external environment data indicating an external environment, a characteristic calculation unit that calculates characteristics of the solar battery in an abnormal state and a threshold value for detecting the abnormal state, using the output voltage value, the output current value, and the external environment data, and an abnormality detection unit that detects the abnormal state of the solar battery, using the characteristics of the solar battery in the abnormal state and the threshold value.

Advantageous Effects of Invention

When the effect of the representative embodiment among the embodiments of the invention is described briefly, it is possible to detect and classify abnormality even during power generation.

DESCRIPTION OF EMBODIMENTS

Figure 1:
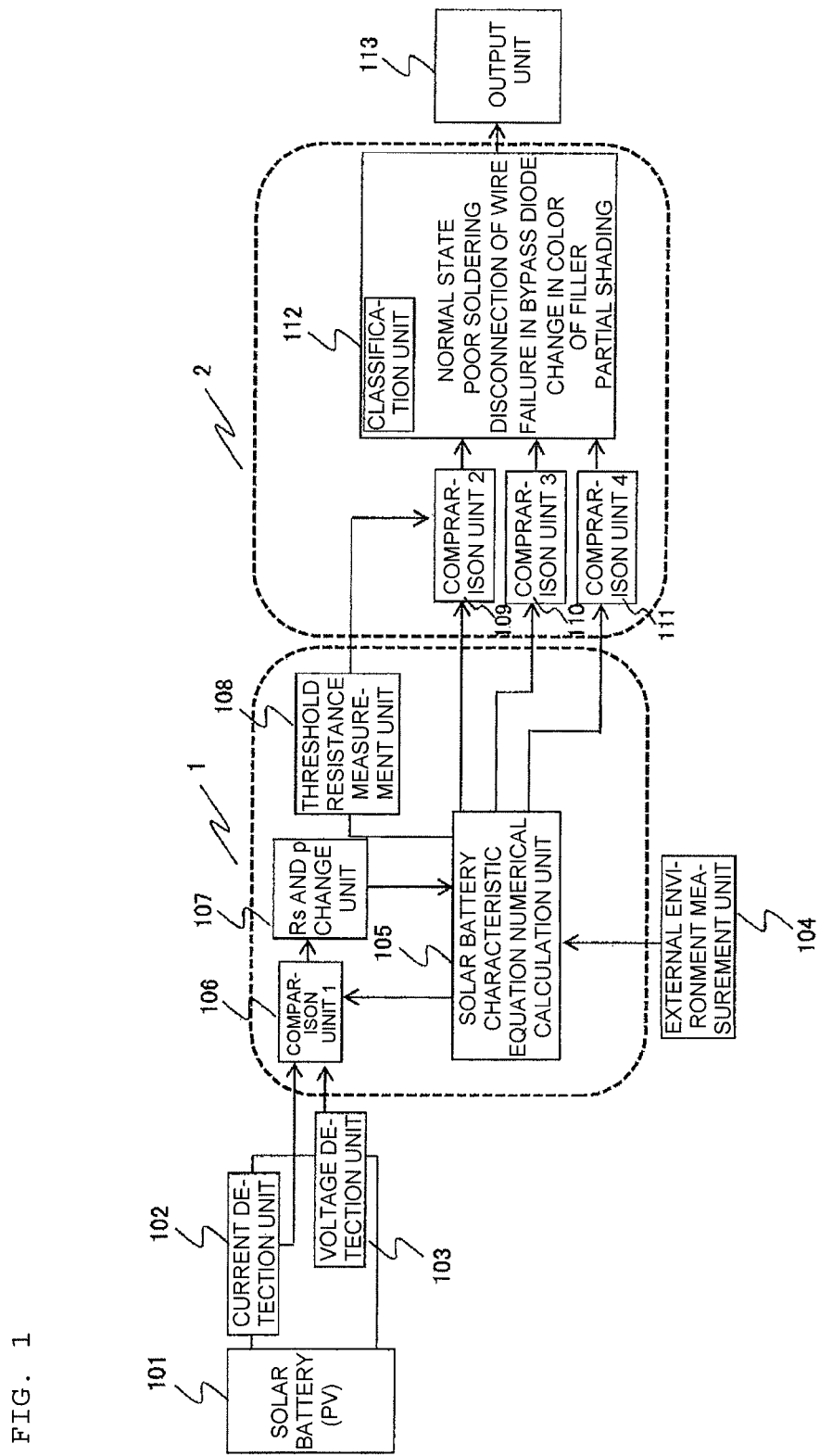
FIG. 1 is a block diagram illustrating an example of the structure of an abnormality detection system according to Example 1.

Representative embodiments of the invention will be described in detail. Reference numerals in the drawings referred to just illustrate the concept of components having the reference numerals attached thereto.

Example 1

First, an abnormality detection system according to a first embodiment of the invention will be described.

FIG. 1 is a block diagram illustrating the structure of the abnormality detection system connected to a solar battery (PV) 101. A current detection unit 102 and a voltage detection unit 103 which are connected to the solar battery 101 are sensors and detect one-point data for an operating voltage and an operating current when the solar battery 101 generates power. The detected voltage value and current value are input to a characteristic calculation unit 1.

The characteristic calculation unit 1 includes a solar battery characteristic equation numerical calculation unit 105, a comparison unit 106, a series resistance value and solar radiation amount change unit (Rs and p change unit) 107, and a threshold resistance calculation unit 108. A microcomputer, a DSP, or a CPU reads various software programs recorded on a recording device and executes the read software programs to implement some or all of the functions. Alternatively, the functions may be implemented by, for example, hardware constructed by a semiconductor integrated circuit.

External environment data (for example, the temperature and data for the amount of solar radiation) indicating an external environment measured by an external environment measurement unit 104, which is, for example, a sensor, is input to the solar battery characteristic equation numerical calculation unit 105 and is used to calculate a solar battery characteristic equation. The calculated voltage value and current value are compared with the voltage value and the current value detected from the solar battery by the comparison unit 1 (106). In this example, attention is focused on that a change in characteristics due to abnormality (for example, a failure or partial shading) in the solar battery is mainly caused by a series resistance value and the amount of solar radiation (which will be described in detail with reference to FIG. 7). The Rs and p change unit 107 changes the series resistance value Rs and the solar radiation amount p in the solar battery characteristic equation on the basis of the comparison result of the comparison unit 1 (106) and the solar battery characteristic equation numerical calculation unit 105 calculates the solar battery characteristic equation again. The process of changing the series resistance value Rs and the solar radiation amount p is repeated until the calculated voltage value and current value coincide with the voltage value and the current value detected by the current detection unit 102 and the voltage detection unit 103. When the calculation result coincide with the detected voltage value and current value, parameters of the characteristic equation are input as the calculation result of the solar battery characteristic equation to the abnormality detection unit 2 in order to determine whether abnormality occurs. At the same time, the threshold resistance calculation unit 108 inputs a threshold resistance value Rth which is used to determine whether a failure occurs to the abnormality detection unit 2.

The abnormality detection unit 2 includes a comparison unit 2 (109), a comparison unit 3 (110), a comparison unit 4 (111), and a classification unit 112. Similarly to the characteristic calculation unit 1, a microcomputer, a DSP, or a CPU reads various software programs recorded on a recording device and executes the read software programs to implement some or all of the functions. Alternatively, the functions may be implemented by, for example, hardware constructed by a semiconductor integrated circuit.

The parameters of the solar battery characteristic equation output from the characteristic calculation unit 1 are input to the comparison unit 2, the comparison unit 3, and the comparison unit 4 for each kind of parameter and the threshold resistance value Rth is input to the comparison unit 2. The comparison results of the comparison unit 2, the comparison unit 3, and the comparison unit 4 are input to the classification unit 112 and the classification unit 112 determines and classifies abnormality (failure or partial shading). The output unit 113 outputs information corresponding to the classification result as a sound or displays the information on a screen of a liquid crystal device to notify the state of the solar battery to the outside. For example, since the disconnection of a wire or a failure in a bypass diode causes a large power loss, an alarm indicating the replacement of the module is sounded or displayed on the liquid crystal device and is output to the outside.

As such, in this example, attention is focused on that a change in characteristics due to abnormality (failure or partial shading) in the solar battery is mainly caused by the series resistance value and the amount of solar radiation, and the solar battery characteristic equation and the threshold resistance value for detecting an abnormal state are calculated on the basis of the voltage value and the current value measured from the solar battery, the temperature, and the amount of solar radiation during power generation. This example is characterized in that the abnormal state is detected using the calculation result. According to the structure of the system, it is possible to detect and classify abnormality in the solar battery, using only one-point data for the operating voltage and the operating current, that is, even during power generation.

Figure 2:
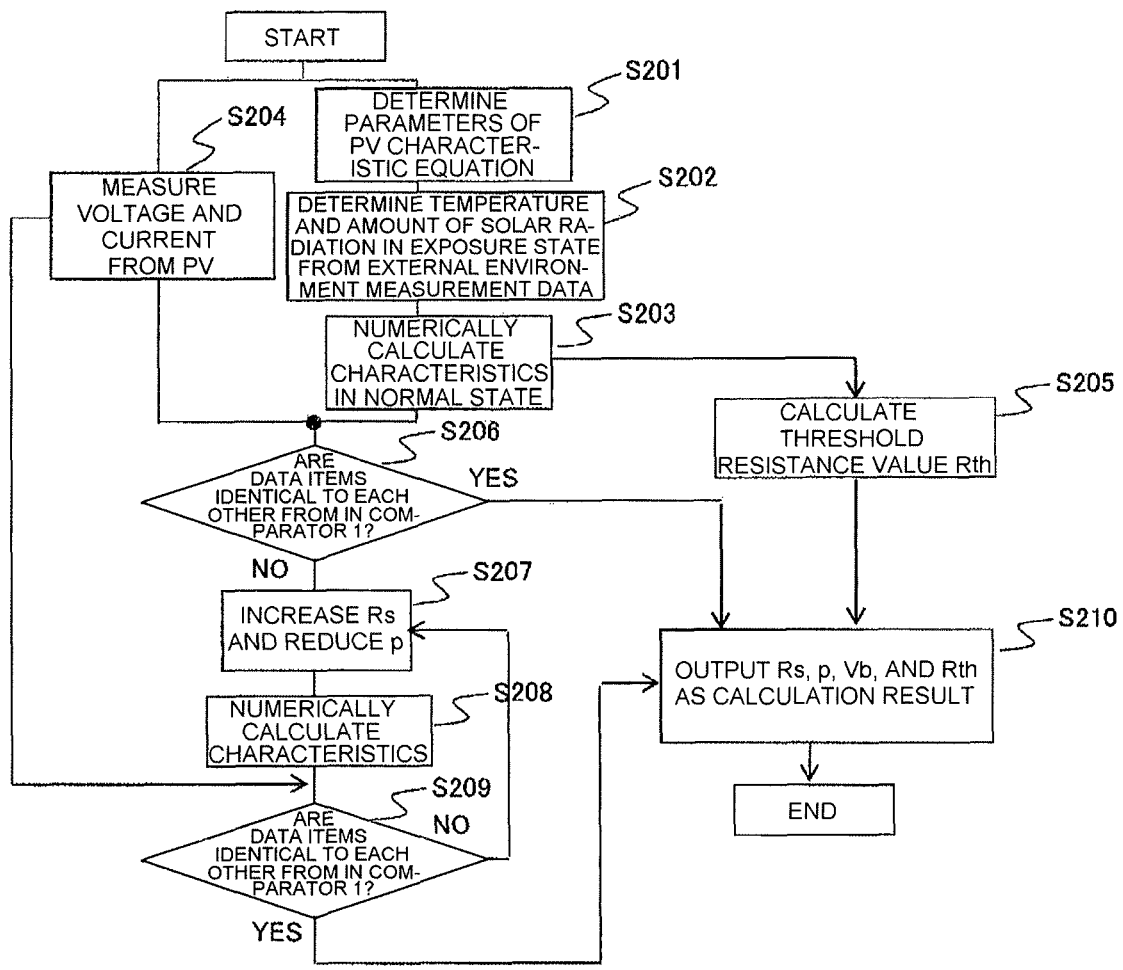
FIG. 2 is an example of a flowchart illustrating the process of a characteristic calculation unit according to Example 1.
Figure 10:
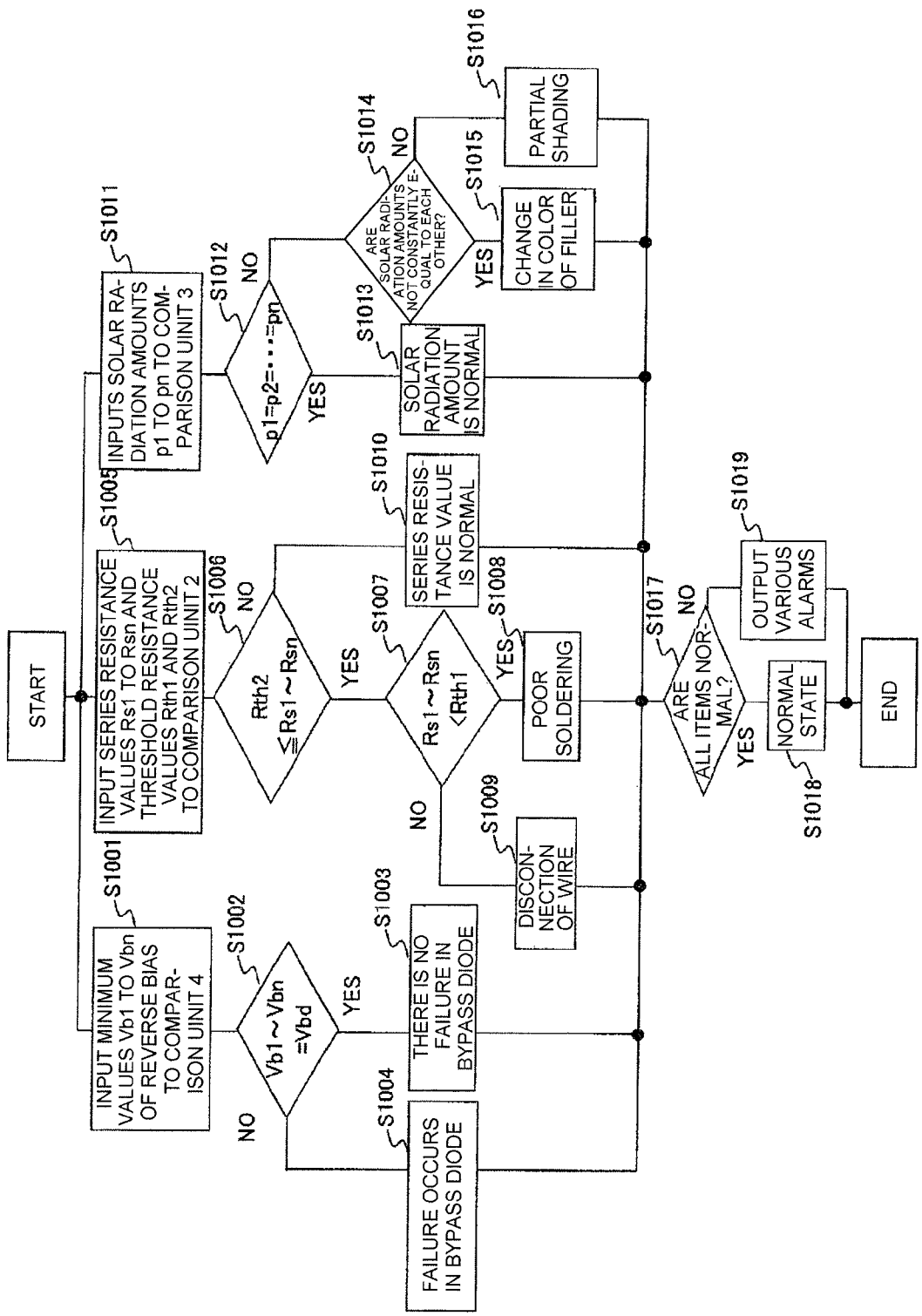
FIG. 10 is an example of a flowchart illustrating the process of an abnormality detection unit according to Example 1.

FIGS. 2 and 10 are flowcharts illustrating the process of the characteristic calculation unit 1 and the abnormality detection unit 2 of the abnormality detection system according to Example 1 of the invention and the system will be described in detail with reference to FIGS. 2 and 10.

First, the flow of the characteristic calculation unit 1 will be described with reference to FIG. 2. When the detection of a failure or partial shading starts, the characteristic calculation unit determines parameters other than a current I and a voltage V in the solar battery characteristic equation represented by Expression 1 under the standard conditions of a temperature T of 25 [° C.] and a solar radiation amount p of 1.0 [kW/m$^2$] (S201).

$$I = Isc \cdot p - Is \cdot \exp\left(\frac{q \cdot (V + I \cdot Rs \cdot Ncell)}{nf \cdot k \cdot T \cdot Ncell}\right) - \frac{V + I \cdot Rs \cdot Ncell}{Rsh \cdot Ncell}$$ [Expression 1]

In the above-mentioned expression, Isc indicates a short-circuit current, p indicates the amount of solar radiation, Is indicates the reverse saturation current of a solar battery cell, of indicates a diode junction constant, k indicates a Boltzmann constant, T indicates an absolute temperature, Ncell indicates the number of cells, q indicates the quantity of electric charge, V indicates a voltage, I indicates a current, Rs indicates the series resistance value of, for example, a wire for connecting the solar battery cells, and Rsh indicates the shunt resistance value of the solar battery cell.

Then, the characteristic calculation unit determines the temperature or the amount of solar radiation from the external environment measurement unit 104 (S202) and numerically calculates the characteristics of the normal state corresponding to the measured temperature or solar radiation conditions (S203). The normal state indicates the characteristics in which no abnormality (failure or partial shading) occurs. In addition, the characteristic calculation unit detects the voltage value and the current value from the solar battery (S204). After the calculation in the normal state ends, the process proceeds to a step (S205) of calculating the threshold resistance value Rth and a step (S206) of comparing the calculation result with the voltage value and the current value of the solar battery which is installed in a power generation environment using the comparison unit 1. When the voltage and current values are identical to each other in the comparison unit 1, the process proceeds to a step (S210) of outputting the series resistance value Rs, the solar radiation amount p, the minimum value Vb of the reverse bias voltage, and the threshold resistance value Rth as the calculation result. When the voltage and current values are not identical to each other in the comparison unit 1, it is determined that a failure or partial shading has occurred and the characteristics of the solar battery in the failure or partial shading are calculated (S207 to S209).

The failure and partial shading characteristics are calculated by increasing the series resistance value Rs, which is a parameter of the solar battery characteristic equation, and reducing the solar radiation amount p which is a parameter of the solar battery characteristic equation (S207). After the parameters are changed, the solar battery characteristic equation is numerically calculated again (S208) and the calculation result is compared with the measured voltage value and current value by the comparison unit 1 (S209). The change of the parameters and the numerical calculation are repeated until the calculation result coincides with the measured voltage and current values in the comparison. When the comparison result shows that the calculation result coincides with the measured voltage and current values only by the change in the series resistance value and the amount of solar radiation, the connection conditions of the bypass diode are changed. After the calculation result coincides with the measured voltage and current values coincide with each other in the comparison, the process proceeds to a step (S210) of outputting the series resistance value Rs, the solar radiation amount p, the minimum value Vb of the reverse bias voltage, and the threshold resistance value Rth as the calculation result.

As such, the numerical calculation of the solar battery characteristic equation is performed using the temperature and the amount of solar radiation measured from the solar battery. Then, the series resistance value and the amount of solar radiation, which are parameters of the solar battery characteristic equation, are changed such that the calculation result coincide with the measured voltage value and current value. Then, the solar battery characteristic equation is numerically calculated, and the series resistance value, the amount of solar radiation, and the minimum value of the reverse bias voltage are calculated. In this way, it is possible to know the characteristics of the solar battery in the power generation environment. In addition, since the threshold resistance value Rth is calculated using the characteristics in the normal state, the abnormality detection unit 2 can classify failures in detail.

Next, the characteristic calculation unit 1 will be described in detail with reference to the solar battery characteristic equation, the numerical calculation, the calculation of failure and partial shading characteristics, and the threshold resistance value.

Figure 3:
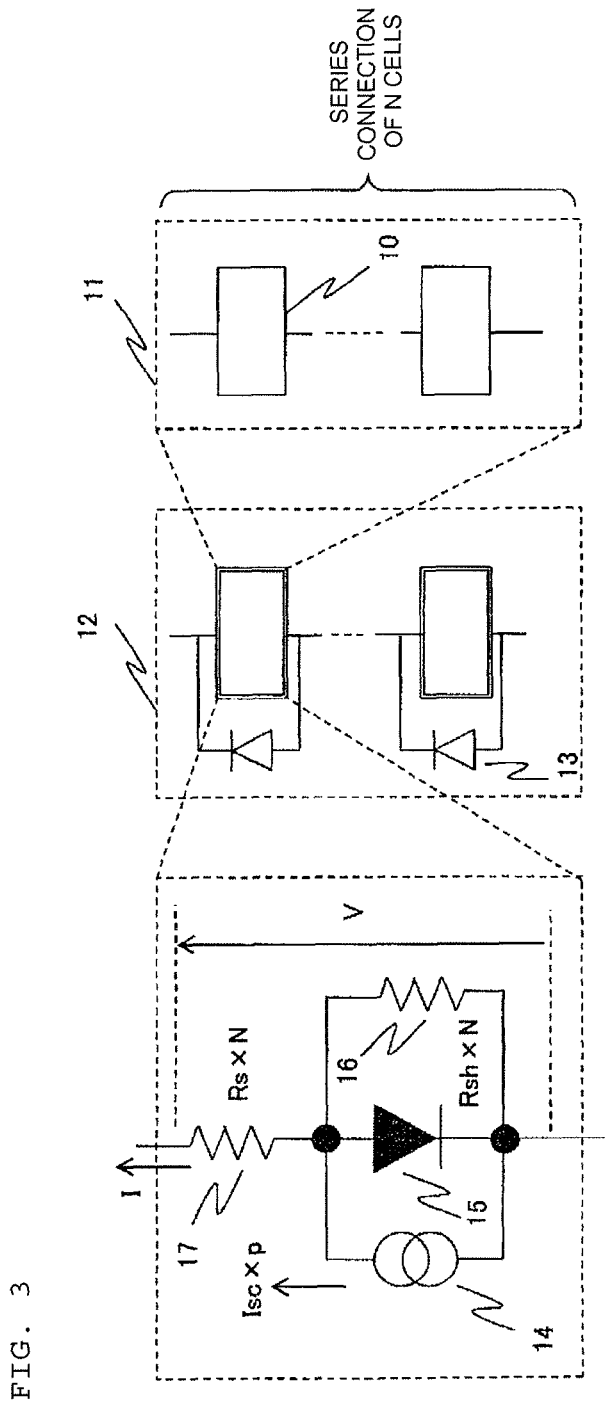
FIG. 3 is a diagram illustrating an example of the structure of a solar battery and an equivalent circuit.

First, the solar battery characteristic equation represented by Expression 1 will be described. FIG. 3 shows an equivalent circuit of the solar battery and Expression 1 indicates the characteristics of the equivalent circuit. The first item of Expression 1 is represented by a DC current source 14, the second item mainly indicates the characteristics of a diode 15, and the third item indicates the characteristics of a shunt resistance value 16. A series resistance value 17 indicates a connection resistance value between cells 10. A solar battery module 12 is formed by connecting a plurality of units each including a series connection of the cells 10 and a bypass diode 13. This unit is referred to as a cluster 11. As can be seen from the above, the solar battery is an aggregate of various units, such as the cells 10 or the clusters 11. Expression 1 can indicate the characteristics of the aggregate. When N=1 is substituted into Expression 1, Expression 1 can indicate the characteristics of the cell 10. When the characteristics of the cluster 11 or the module 12 in which the cells 10 are connected in series are indicated, N is set to the number of cells connected in series in the cluster 11 or the module 12 under the condition that the cells have substantially the same performance to perform calculation in a large unit. This is referred to as a unit of calculation in the specification.

For example, when the characteristics of the module 12 are calculated, the following selection and change can be performed. First, when calculation is performed for each cell and the module 12 includes, for example, 54 cells, the characteristic equation is calculated 54 times and the characteristic equations are added to obtain the characteristics of the module 12. In this case, since the characteristics can be represented in the unit of the cell 10, the accuracy of the calculation result is very high, but a calculation load increases.

Next, when calculation is performed in the unit of the module 12 or the cluster 11, it is possible to significantly reduce the number of calculations. In the solar battery with a small variation in the characteristics of the cell, it is also effective to select a large unit of calculation. When a large unit of calculation is used, the temperature or the amount of solar radiation slightly varies depending on the cell, but the characteristics may be averaged and calculated in each unit of calculation.

Next, the step (S201) of determining a plurality of parameters in Expression 1 will be described. In this example, the parameters under the standard conditions of a temperature T of 25 [° C.] and a solar radiation amount p of 1.0 [kW/m$^2$] are determined as initial values. Various methods have been known as a method of setting the parameters. For example, there is a method which determines each parameter on the basis of an open voltage Voc, a short-circuit current Isc, an operating voltage Vop, an operating current Iop, and a module series resistance value under the standard conditions which are given by a module manufacturer, a temperature coefficient α indicating a variation in Isc each time the temperature is changed by 1° C., a temperature coefficient β indicating a variation in Voc each time the temperature is changed by 1° C., and a curve correction factor K.

Then, the temperature T and the solar radiation amount p in the power generation environment are determined on the basis of data measured by the external environment measurement unit and the temperature characteristics and solar radiation characteristics of the solar battery are calculated (S202). Then, the parameters of the characteristic equation are changed from the initial values (S203).

The external environment measurement unit 104 includes a sensor which measures the temperature and the amount of solar radiation of the solar battery. Alternatively, the external environment measurement unit 104 may include a reference cell which is made of the same material as that forming the solar battery and a CPU or a semiconductor integrated circuit which measures the short-circuit current and open voltage of the reference cell to calculate the temperature and the amount of solar radiation. The short-circuit current and open voltage of the reference cell can be acquired by short-circuiting or opening an electrode using a switch which is formed by, for example, a semiconductor integrated circuit. The amount of solar radiation can be calculated by dividing the measured short-circuit current by a short-circuit current in the standard conditions. The differential temperature from 25° C. can be calculated by subtracting an open voltage in the standard conditions from the measured open voltage and dividing the calculation result by the temperature coefficient β and the number of cells forming the module.

Next, the numerical calculation (S203 and S208) will be described in detail with reference to FIG. 4. When the parameters of the characteristic equation are determined and the process proceeds to the numerical calculation step, first, the current I of Expression 1 is set to 0 (S401) and the corresponding voltage V is calculated (S402). There are various numerical calculation methods for calculating the voltage V. For example, when the voltage V is calculated by the known Newton's method, an initial value Vtmp required in the use of the Newton's method is set as shown in Expression 2.

$$Vtmp = \frac{\ln((Isc \cdot p - I)/Is)}{q/(nf \cdot k \cdot T \cdot Ncell)} \qquad \text{[Expression 2]}$$

Then, it is determined whether the initial value Vtmp is positive or negative (S403). When the initial value Vtmp is positive, the voltage V corresponding to the current I is calculated by the Newton's method (S404). When the initial value Vtmp is negative, the voltage V is set to a breakdown voltage (S405) and a current I0 corresponding to the voltage is calculated (S406). It is determined whether the current I0 is equal to a predetermined current I (S407). When the current I0 is equal to the predetermined current I, the process proceeds to a step of calculating the operation characteristics of the bypass diode (S408).

In this example, the calculation method is changed depending on the connection conditions of the bypass diode (when the bypass diode is connected and when the bypass diode is not connected (the bypass diode is defective)). In Step S203, calculation is performed, assuming that the solar battery is in the normal state and the bypass diode is connected. In Step S208, when the calculation result is not equal to the measured voltages and current values in comparison only by changing the series resistance value and the amount of solar radiation, it is determined that the bypass diode is not connected and the breakdown voltage V is output. When the bypass diode is connected, it is determined whether the operating voltage Vbd of the bypass diode is higher than the voltage V (S410). When the operating voltage Vbd is higher than the voltage V, the voltage V is set to Vbd (S411).

In Step S407, when the current I0 is not equal to the current I, the voltage V is changed by ΔV (S409) and the current I0 is calculated again. Then, the current I0 is re-calculated until it coincides with the current I.

The calculation of the voltage V with respect to the current I ends, and it is determined whether the current I is equal to a predetermined current Imax (S412). When the current I is equal to the current Imax, the flow of the numerical calculation ends. On the other hand, when the current I is less than the predetermined current Imax, the current is increased by ΔI and the above-mentioned flow is repeated (S413).

The numerical calculation method is characterized in that the numerical calculation method is changed depending on whether the initial value Vtmp is within the positive voltage range (first quadrant) or the negative voltage range (second quadrant). In the calculation method, since numerical calculation can be accurately performed regardless of the quadrant, it is possible to accurately calculate the failure or partial shading characteristics of the solar battery including, for example, the failure of the bypass diode. Next, the numerical calculation method will be described in detail.

Figure 5:
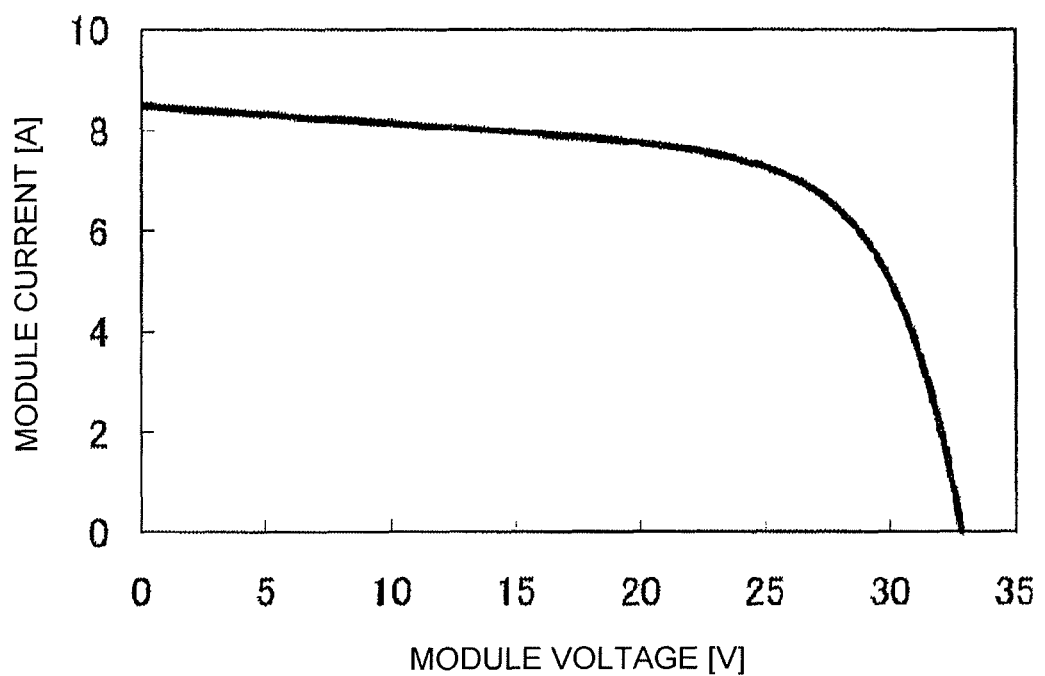
FIG. 5 is a diagram illustrating an example of the characteristics of the solar battery in the first quadrant which are calculated using the flowchart shown in FIG. 4.

FIG. 5 shows the calculation result of the characteristics of the module 12 in the positive voltage range (first quadrant) by the Newton's method. The voltage V is calculated using the current I as a parameter to accurately represent an inflection point of the current-voltage characteristics. However, in the calculation using only the Newton's method, the accuracy of calculation is significantly reduced in the negative voltage range (second quadrant). In a case in which the above-mentioned Expression 2 is used as the initial value, when the current I is more than Isc·p, that is, when the negative voltage is output as the calculation result, a natural logarithm ln outputs an indefinite value. Therefore, it is difficult to accurately calculate the characteristics of the second quadrant.

Figure 4:
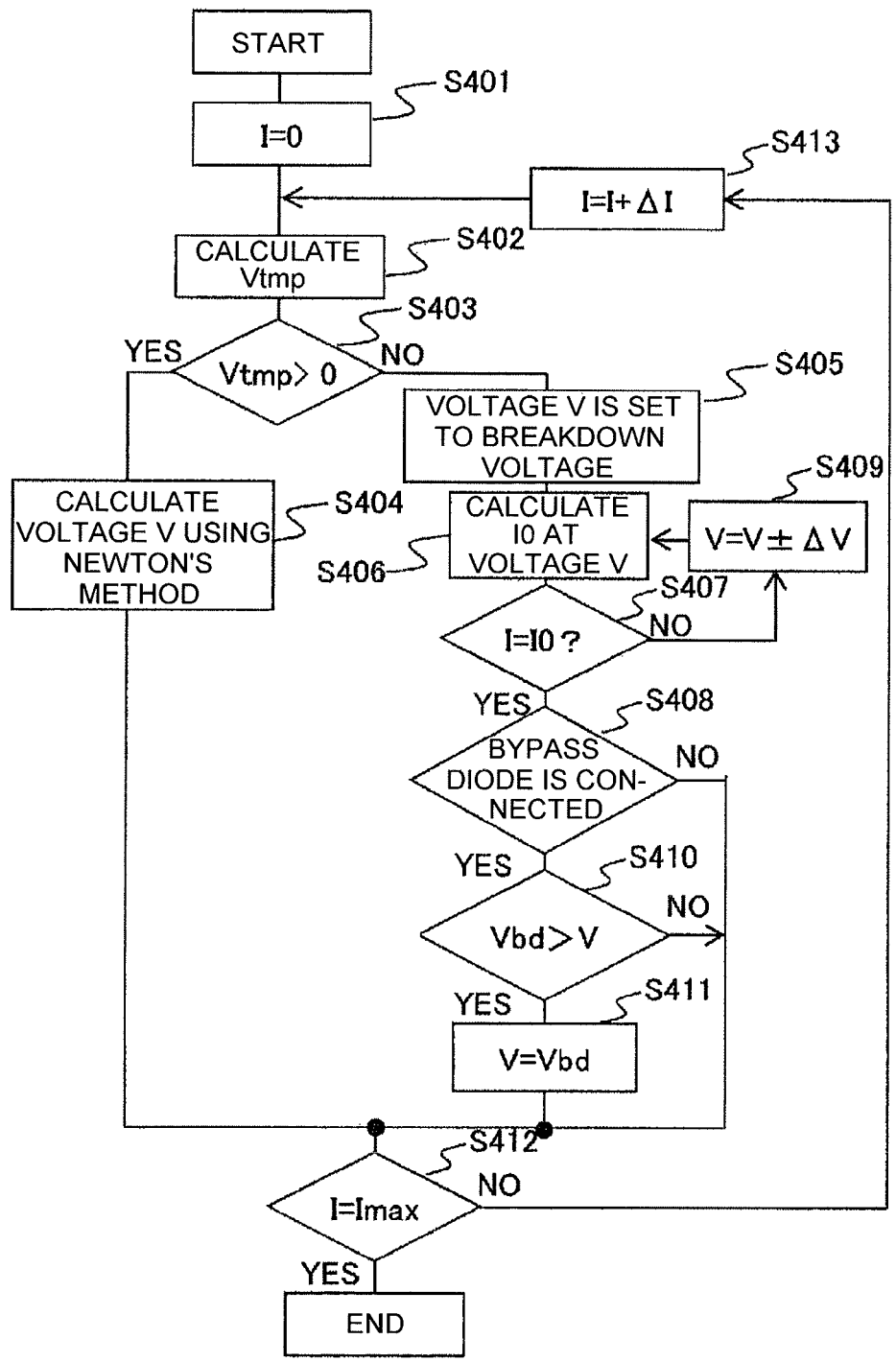
FIG. 4 is an example of a flowchart illustrating the process of a solar battery characteristic equation numerical calculation unit according to Example 1.

As shown in FIG. 4, the Newton's method is used in the positive voltage range (first quadrant). In the negative voltage range (second quadrant), the following numerical calculation is performed: the voltage is set to the breakdown voltage and is then sequentially changed at an interval of ΔV to calculate the current I0 and the current I is searched. Therefore, it is possible to calculate the solar battery characteristics, regardless of the quadrant.

Figure 6A:
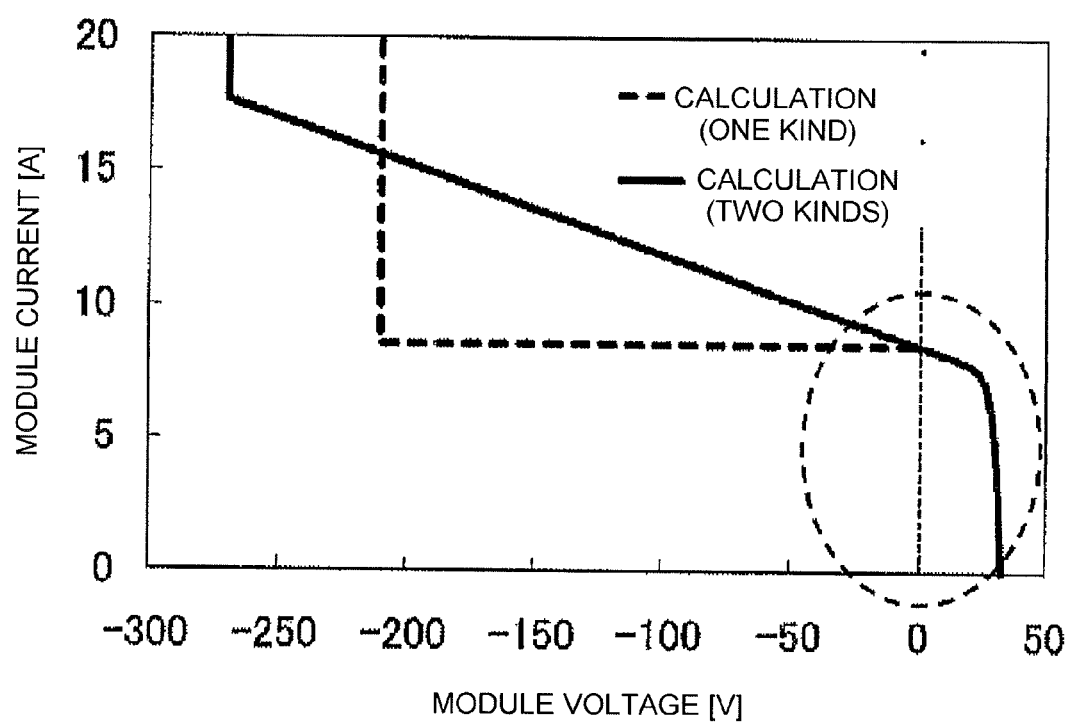
FIG. 6(a) is a diagram illustrating an example of the characteristics of the solar battery which are calculated using the flowchart shown in FIG. 4 and an example of the characteristics of the solar battery which are calculated only by one numerical calculation method.
Figure 6B:
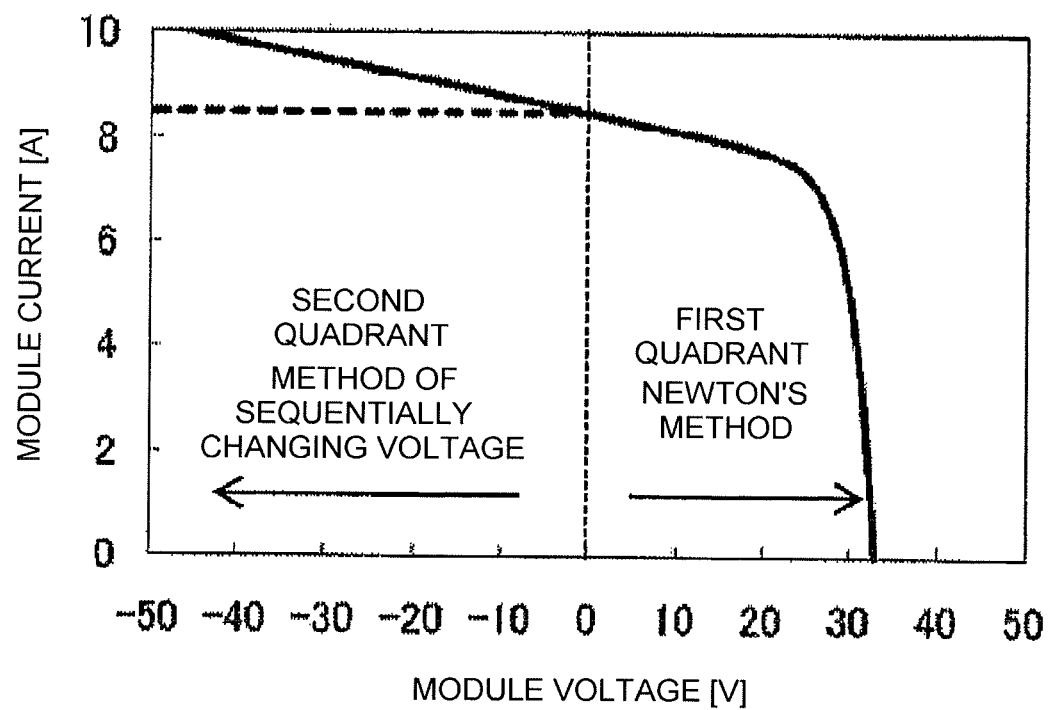
FIG. 6(b) is an example of an enlarged view illustrating a portion surrounded by a dotted line in FIG. 6(a).

FIG. 6 shows the calculation results when the characteristics are calculated only by one kind of calculation method and when the characteristics are calculated by two kinds of calculation methods. FIG. 6(b) is an enlarge view of the voltage range of −50V to +50V in FIG. 6(a). When the characteristics are calculated by one kind of calculation method, the correct calculation result is not output in the negative voltage range and an inflection point occurs on the graph. However, when two kinds of calculation methods are used, the calculation range is changed from the positive voltage to the negative voltage, but the characteristics are reproduced by a smooth change. It is possible to calculate correct characteristics. This calculation method is particularly effective in reproducing the characteristics when a failure occurs in the bypass diode. In general, in the negative voltage range (second quadrant), since the bypass diode operates, the calculation result is saturated by the operating voltage Vbd of the bypass diode. However, when the bypass diode is not connected or when the bypass diode is defective, a high negative voltage is generated as diode characteristics. It is assumed that the minimum value of the high negative voltage is the minimum value Vb of the reverse bias voltage. It is possible to determine whether a failure occurs in the bypass diode on the basis of a difference in the calculation result.

In addition, the calculation of the failure and partial shading characteristics (S206 to S209) will be described in detail. The failure and partial shading characteristics are calculated using the fact that a change in the characteristics due to failure or partial shading shown in FIG. 7 can be reproduced by changing the parameters, such as the series resistance value Rs and the solar radiation amount p. Therefore, it is possible to easily calculate the failure and partial shading characteristics, which will be described in detail below.

After the calculation of the normal characteristics in a power generation state ends, the voltage value and the current value measured from the solar battery and the voltage value and the current value which are the calculation results of the normal characteristics are input to the comparison unit 1 (S206). Comparison unit 1 needs to output the comparison result, considering an error in the calculation of the characteristics. When it is known in advance that the calculation result of the characteristics is within a predetermined error range (for example, ±1%) of the measured value, comparison unit 1 determines that the calculation result is identical to the measurement result if the error is within a range of ±1%. On the other hand, when there is an error of ±1% or more between the calculation result of the characteristics and the measurement result, it is considered that a failure or partial shading occurs and the calculation of the failure and partial shading characteristics starts.

The kind of failure or partial shading is shown as the current-voltage characteristics in FIG. 7. FIG. 7(a) shows a failure mode which is called poor soldering and also shows a phenomenon in which the solder of a wire connection portion between the cells 10 deteriorates and the series resistance value 17 shown in FIG. 3 increases. The cell with high resistance generates heat and the temperature increases. As a result, as the current-voltage characteristics, the characteristics of the diode deteriorate and output power is reduced.

Figure 7A:
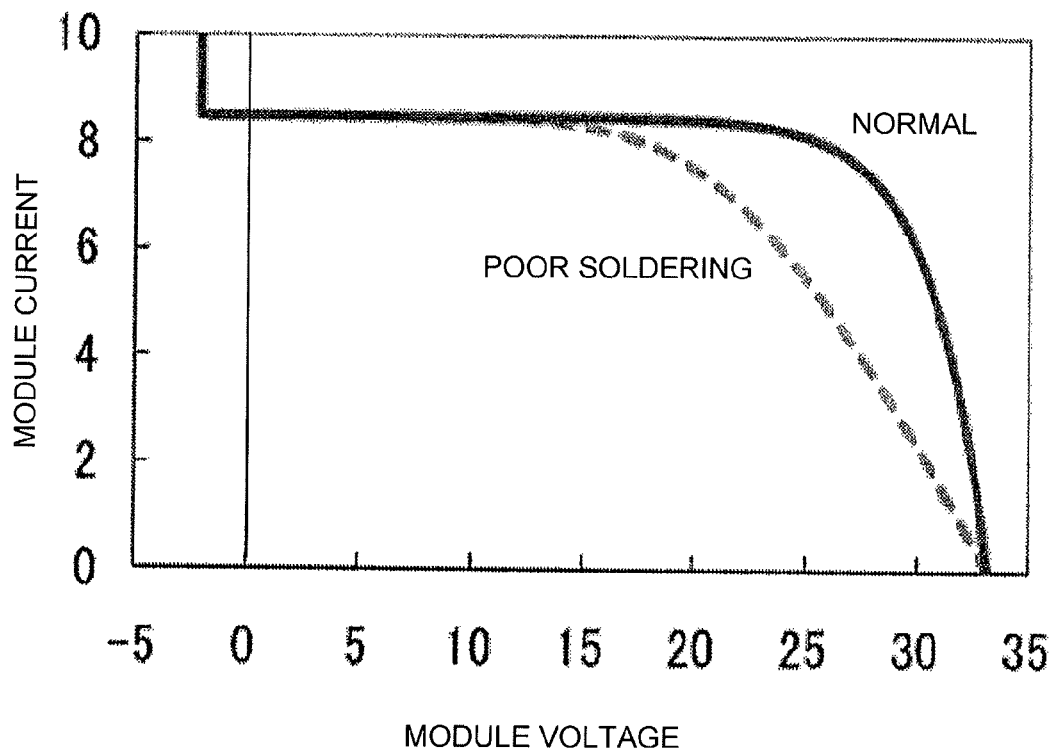
FIG. 7(a) is a diagram illustrating an example of the current-voltage characteristics when poor soldering occurs in the solar battery.
Figure 7B:
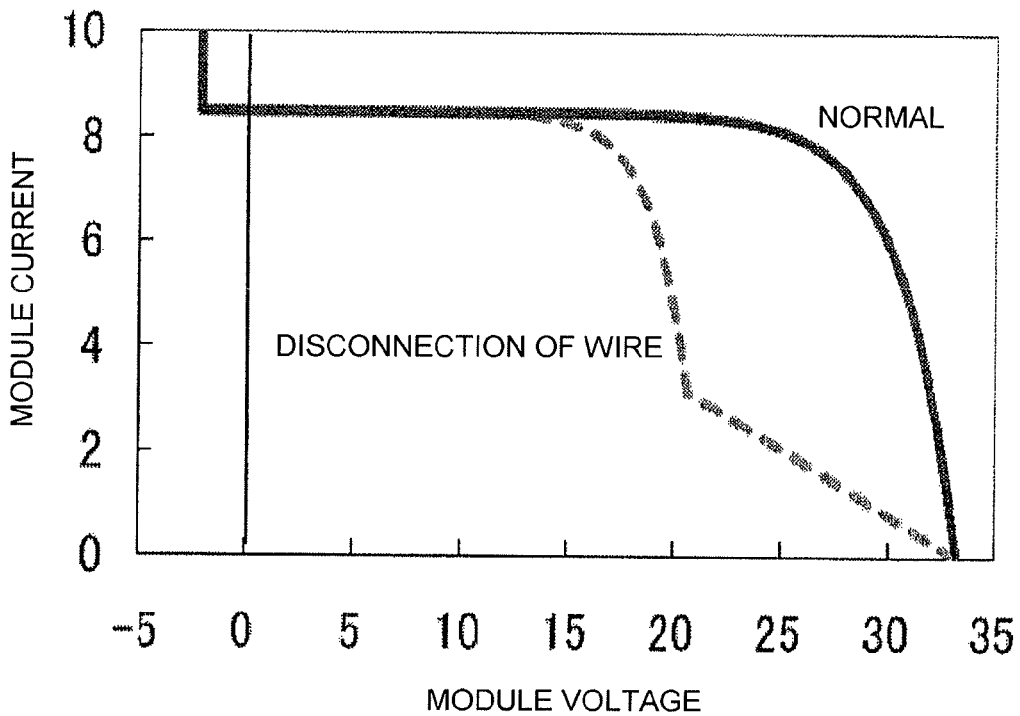
FIG. 7(b) is a diagram illustrating an example of the current-voltage characteristics when the disconnection of a wire occurs in the solar battery.

FIG. 7(b) shows a failure mode which is called wire disconnection and also shows a state in which solder completely peels off and a space between the cells is opened. The disconnected cell is equivalent to the state in which the series resistance value 17 is very large and a current is less likely to flow to the cluster including the disconnected cell. When other clusters are normal, the bypass diode operates in the defective cluster and the current is bypassed in order to make a necessary operating current flow. A major inflection point occurs as the current-voltage characteristics.

Figure 7C:
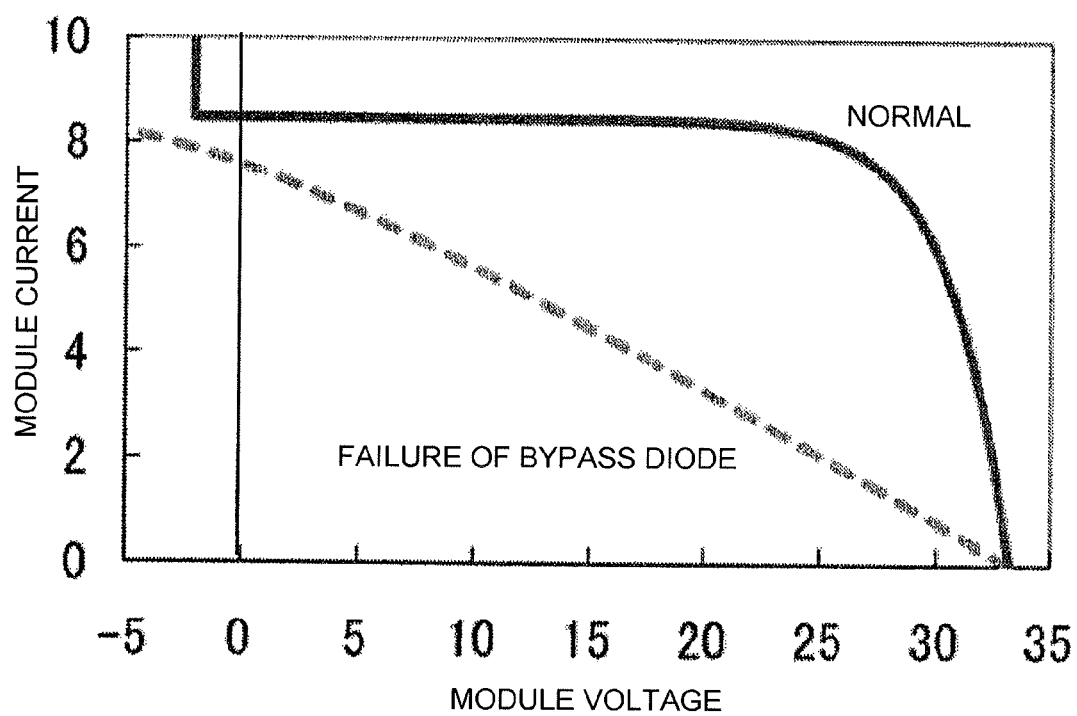
FIG. 7(c) is a diagram illustrating an example of the current-voltage characteristics when a failure occurs in a bypass diode in the solar battery.

FIG. 7(c) shows current-voltage characteristics indicating a failure in the bypass diode. The characteristics of the failure are that the characteristics of the solar battery are not saturated by the operating voltage Vbd of the bypass diode in the negative voltage range (second quadrant) and the series resistance value increases. As shown in FIG. 6, the voltage which is not saturated by the operating voltage Vbd is saturated by a high negative voltage (the minimum value Vb of the reverse bias voltage lower than the operating voltage Vbd).

Figure 7D:
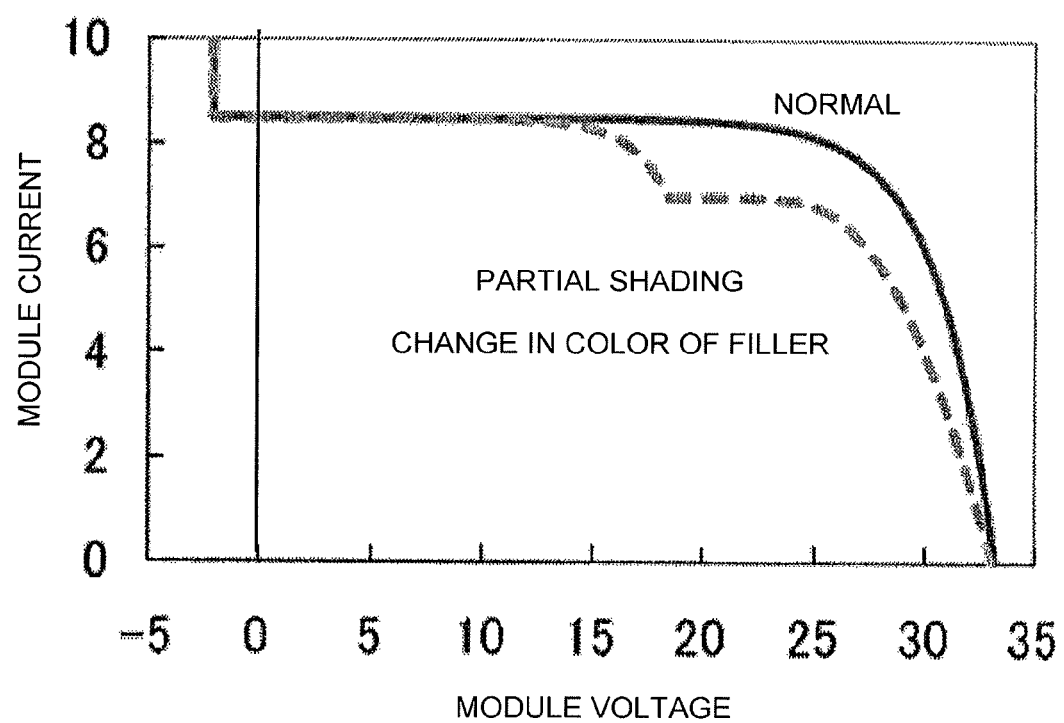
FIG. 7(d) is a diagram illustrating an example of the current-voltage characteristics when partial shading or a change in the color of a filler occurs in the solar battery.

FIG. 7(d) shows characteristics indicating partial shading or a change in the color of a filler. The two phenomena are characterized in that the amount of solar radiation in some clusters is less than that of the other clusters, and an inflection point occurs in the current-voltage characteristics in a shape different from that when the wire is disconnected.

As described above, it has been known that a change in the failure and partial shading characteristics is mainly caused by the solar radiation amount p and the series resistance value Rs. That is, the failure or partial shading characteristics can be calculated by increasing Rs and reducing the solar radiation amount p, among the parameters of the characteristic equation in the normal state (S207). After the parameters are changed, the numerical calculation is performed again (S208) and the calculation result is compared with the voltage value and the current value measured from the solar battery (S209). Then, Rs or p is changed until the calculation result coincides with the measured voltage and current values in the comparison. For example, a least-square method may be used as a method of changing the parameters. In some cases, when a failure occurs, a portion of the solar battery generates heat or the connection conditions of the bypass diode are changed. Therefore, in Step S208, the solar battery characteristic equation numerical calculation unit changes the temperature or the connection conditions of the bypass diode for each unit of calculation and calculates the characteristic equation again. When the calculation result is identical to the measurement result, the series resistance value Rs, the solar radiation amount p, and the minimum value Vb of the reverse bias voltage for each unit of calculation are input as the calculation result of the characteristic calculation unit to the abnormality detection unit 2 (S210).

Next, the calculation of the threshold resistance value Rth (S205) will be described in detail. The threshold resistance value Rth is used to classify poor soldering and wire disconnection caused by the deterioration of a resistor and is input together with the series resistance value Rs, the solar radiation amount p, and the minimum value Vb of the reverse bias voltage to the abnormality detection unit 2. The abnormality detection unit 2 classifies the failure or partial shading of the solar battery into the characteristics shown in FIG. 7, using the data input from the characteristic calculation unit.

Poor soldering and a disconnection failure cannot be classified only by the series resistance value Rs, the solar radiation amount p, and the minimum value Vb of the reverse bias voltage. As shown in FIG. 7, poor soldering and a wire disconnection failure are determined by the degree of increase in the series resistance value. The two failures can be classified by setting a threshold value to the resistance value which is output from the characteristic calculation unit. The threshold resistance value Rth can be determined as follows.

First, a method of calculating threshold resistance value 1 (Rth1) for detecting the disconnection of a wire will be described. The wire disconnection failure indicates a state in which solder connecting the cells peels off and the operating current of a normal cluster does not flow to a cluster including a defective cell. At that time, the bypass diode connected to the defective cluster operates to form a bypass for applying a necessary operating current.

Figure 8:
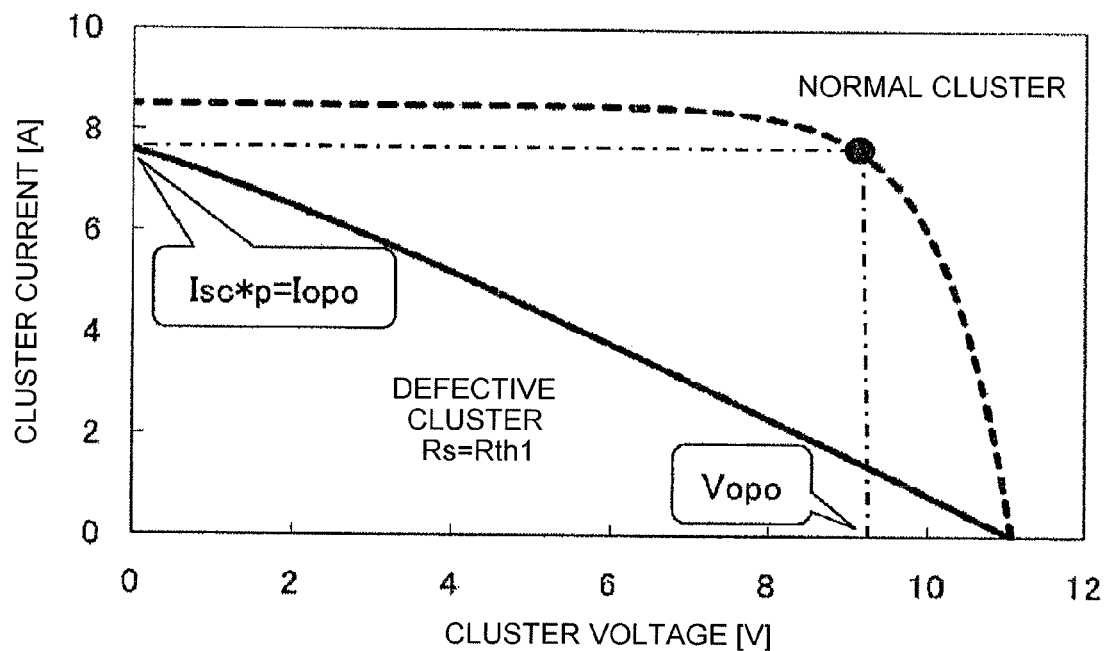
FIG. 8 is a diagram illustrating an example of the current-voltage characteristics of a cluster indicating the disconnection of a wire according to Example 1.

When this is represented as current-voltage characteristics, as shown in FIG. 8, the resistance value increases until a maximum current Isc*p (the short-circuit current Isc×the solar radiation amount p) in the power generation environment of the defective cluster coincides with the operating current Iopo of a normal cluster in the power generation environment. At that time, the series resistance value Rs can be calculated by substituting 0 to the voltage V, inputting the normal operating current Iopo in the power generation state to the current I, inputting the amount of solar radiation in a power generation site to the solar radiation amount p, and inputting the number of cells forming the cluster to Ncell in Expression 1. It can be assumed that Rsh is generally a very large value. As a result, Expression 3 represents threshold resistance value 1 (Rth1) indicating the wire disconnection failure.

$$Rth1 = \frac{\frac{\ln((Isc \cdot p - Iopo)/Is)}{q/(nf \cdot k \cdot T \cdot Ncell)}}{Iopo} \quad \text{[Expression 3]}$$

Next, a method of calculating threshold resistance value 2 (Rth2) for classifying poor soldering will be described. Threshold resistance value 2 (Rth2) can be defined by the amount of loss of power generated by the module. In the JIS standard, a failure with a power loss of 10% is defined as poor soldering.

Figure 9:
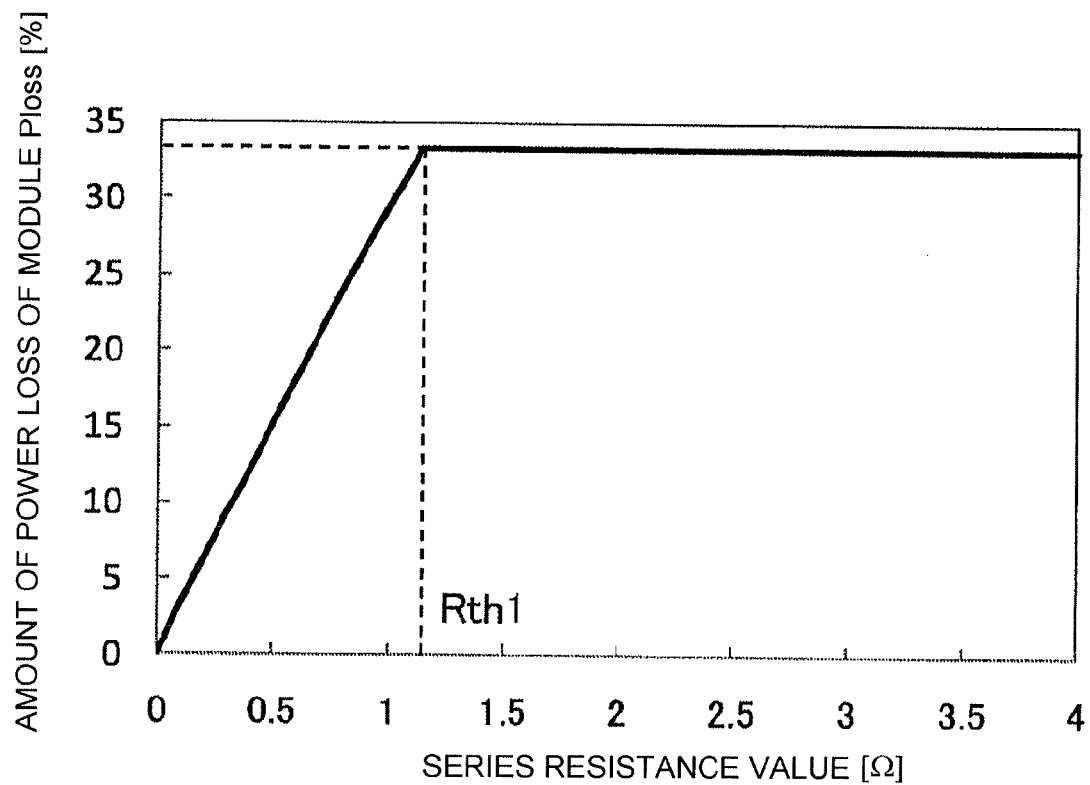
FIG. 9 is a diagram illustrating an example of the relationship between the series resistance value of the solar battery according to Example 1 and the power loss of a module including three clusters.

FIG. 9 is a graph illustrating the series resistance value Rs and the amount of power loss when a failure occurs in one cluster in a module including three clusters. As shown in the graph, when the series resistance value Rs increases to Rth1, the amount of power loss with respect to the series resistance value Rs is changed. When the series resistance value Rs is equal to or greater than Rth1, the wire is disconnected. Therefore, the bypass diode operates to maintain the amount of power loss to be constant. This graph can be represented by Expression 8. Expressions 4 to 5 show the derivation process of Expression 8. In the expression, n is the number of clusters forming the module, m is the number of defective clusters, and $I_E$ is the operating current of a defective solar battery in the power generation environment. For example, according to Expression 8, when the series resistance value Rs where the amount of power loss is 10% is defined as poor soldering, 0.1 is substituted into $P_{loss}$, the operating current when the amount of power loss is 10% is substituted into $I_E$, and the equation is solved in terms of the series resistance value Rs to calculate Rth2.

When the series resistance value Rs and the operating current IE can be measured in the power generation site, it is possible to easily calculate the amount of power loss due to an increase in the series resistance value Rs in the power generation site, without measuring the amount of power loss in a room using, for example, a solar simulator.

Next, the derivation process of Expression 8 will be described. Expression 4 indicates the amount of power loss of the module due to the deteriorated series resistance using Expression 1. In Expression 4, the denominator indicates the amount of power generated in the normal state and the numerator indicates the amount of power loss due the series resistance value Rs. Expression 5 is calculated by differentiating Expression 4 with respect to the series resistance Rs and indicates a variation in the amount of power loss with respect to a change in the series resistance value Rs. Expression 6 indicates the amount of power loss of the module using Expression 5. The first item indicates the amount of power loss when the series resistance value Rs is equal to or greater than Rth1, that is, when the wire is disconnected, and the second item indicates a variation in power until the wire is disconnected.

Figure 12:
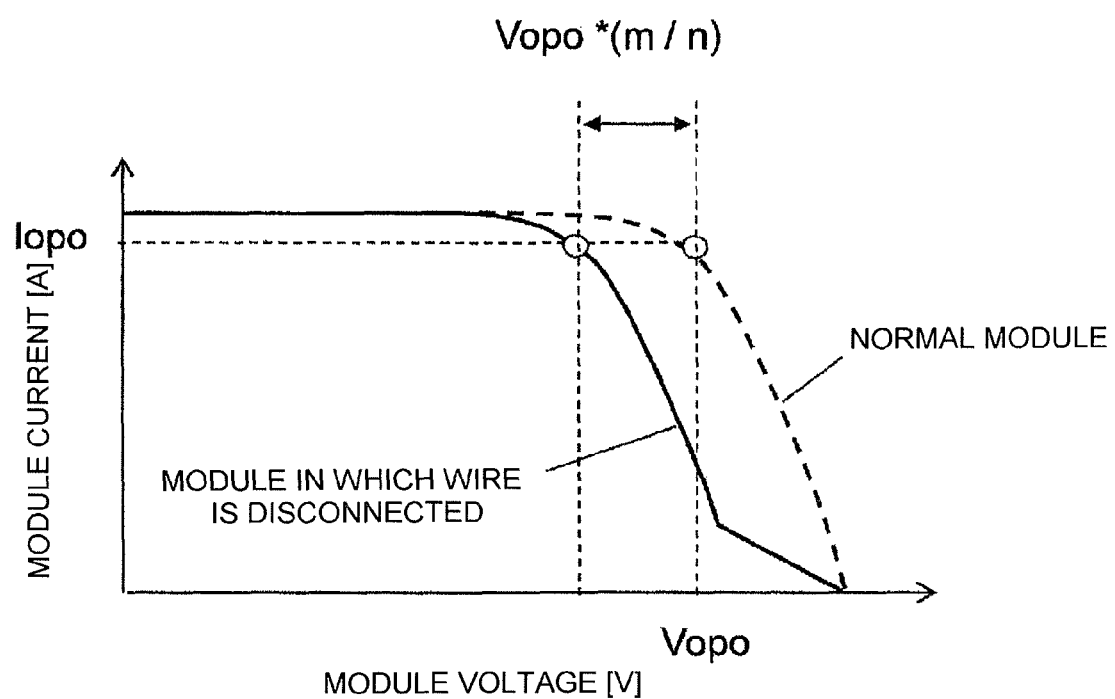
FIG. 12 is a diagram illustrating an example of the current-voltage characteristics when a wire disconnection failure occurs in a power generation environment in a solar battery module.

FIG. 12 shows the current-voltage characteristics of the cluster when the wire is disconnected. As shown in FIG. 12, when the wire is disconnected, the operating current Iopo in the power generation environment is equal to that in the normal state and only the operating voltage Vopo in the power generation environment is reduced by a value corresponding to the defective cluster. That is, the amount of power loss can be defined by the ratio of the number of defective clusters m and the number of clusters n forming the module. As such, the amount of power loss when the wire is disconnected and the variation in power until the wire is disconnected are added to easily indicate the amount of power loss. When the expression changes to Expressions 7 and 8, the amount of power loss can be defined by Rth1.

$$P_{loss} = \frac{-m \cdot I_E^2 \cdot Rs}{n \cdot Iopo \cdot Ncell \cdot \left(\frac{(nf \cdot k \cdot T)}{q} \cdot \ln\frac{Isc \cdot p - Iopo}{Is}\right)} \quad \text{[Expression 4]}$$

$$\frac{\partial P_{loss}}{\partial Rs} = \frac{-m \cdot I_E^2}{n \cdot \left\{Ncell \cdot Iopo \cdot \left(\frac{(nf \cdot k \cdot T)}{q} \cdot \ln\frac{Isc \cdot p - Iopo}{Is}\right)\right\}} \quad \text{[Expression 5]}$$

$$P_{loss} = \left\{\frac{\left(Vopo \cdot \frac{m}{n}\right) \cdot Iopo}{Vopo \cdot Iopo}\right\} + \frac{\partial P_{loss}}{\partial Rs} \cdot (Rth1 - Rs) \quad \text{[Expression 6]}$$

$$P_{loss} = \frac{m}{n} + \frac{-m \cdot I_E^2}{n \cdot (Iopo^2 \cdot Rth1)} \cdot (Rth1 - Rs) \quad \text{[Expression 7]}$$

$$P_{loss} = \frac{m}{n} - \frac{I_E^2}{Iopo^2} \cdot \frac{m}{n} \cdot \left(1 - \frac{Rs}{Rth1}\right) \; (Rs < R_{th1}) \quad \text{[Expression 8]}$$

$$P_{loss} = \frac{m}{n} \; (R_{th1} \leq Rs)$$

As such, the current-voltage characteristics are calculated for each unit of calculation and the calculated current-voltage characteristics are used to calculate threshold resistance value 1 (Rth1) for detecting the disconnection of a wire and threshold resistance value 2 (Rth2) for detecting poor soldering. Therefore, it is possible to classify the disconnection of a wire and poor soldering, using the series resistance value which depends on the disconnection of a wire and poor soldering.

Next, the abnormality detection unit 2 will be described with reference to FIG. 10. After the series resistance value Rs, the solar radiation amount p, and the minimum value Vb of the reverse bias voltage for each unit of calculation are input to the abnormality detection unit 2, a comparison operation is performed for each of the input values. Then, the classification unit 112 classifies normality and abnormality. Specifically, the classification unit 112 detects and classifies normality, a failure (poor soldering, the disconnection of a wire, a failure of the bypass diode, and a change in the color of a filler), and partial shading.

The minimum values Vb1 to Vbn (when there are n units of calculation) of the reverse bias for each unit of calculation are input to comparison unit 4 (S1001) and comparison unit 4 determines whether the minimum values are equal to the operating voltage of the bypass diode (S1002). When a unit of calculation has the minimum value equal to the operating voltage of the bypass diode, it is determined that 'no abnormality occurs in the bypass diode' in the unit of calculation (S1003). When a unit of calculation has the minimum value that is not equal to the operating voltage of the bypass diode, it is determined that a 'failure occurs in the bypass diode' in the unit of calculation (S1004).

The series resistance values Rs1 to Rsn (when there are n units of calculation) for each unit of calculation are input to comparison unit 2 (S1005) and are compared with the threshold resistance values Rth1 and Rth2 (S1006 and S1007). When a unit of calculation satisfies Rht2<'Rs1 to Rsn'<Rth1, the classification unit determines that 'poor soldering' occurs in the corresponding unit of calculation (S1008). When a unit of calculation satisfies Rth1<'Rs1 to Rsn', the classification unit determines that the 'disconnection of a wire' occurs in the corresponding unit of calculation (S1009). In addition, when a unit of calculation satisfies 'Rs1 to Rsn'<Rth2, the classification unit determines that 'no abnormality occurs in the series resistance value' in the corresponding unit of calculation (S1010).

The solar radiation amounts p1 to pn (when there are n units of calculation) for each unit of calculation are input to comparison unit 3 (S1011) and it is determined whether the solar radiation amounts for n units of calculation are equal to each other (S1012). When partial shading and a change in the color of a filler do not occur, it is determined that the solar radiation amounts depending on the partial shading and the change in the color are equal to each other for all units of calculation. When the solar radiation amounts for n units of calculation are equal to each other, it is determined that there is 'no abnormality in the solar radiation amount' (S1013). When all of the solar radiation amounts are not equal to each other, the abnormalities are classified into partial shading and a change in the color of a filler. At that time, it is determined whether the solar radiation amounts are not constantly equal to each other (S1014). When the solar radiation amounts are not constantly equal to each other, it is determined that a change in the color of a filler occurs (S1015). When the solar radiation amounts are not temporarily equal to each other, it is determined that partial shading occurs (S1016). Whether the solar radiation amounts are not equal to each other constantly or temporarily is determined on the basis of whether the ratio of the number of times the solar radiation amounts are not equal to each other to the total number of measurements is greater than a predetermined value.

Then, it is determined whether there is no abnormality for all items (S1017). When it is determined that there is no abnormality, it is determined that the system is normal (S1018). On the other hand, when it is determined that there is abnormality, various alarms are output from the output unit 113 according to the content of the classification (S1019).

As such, the abnormality detection unit 2 can accurately classify a failure and partial shading using the parameters of the solar battery characteristic equation and the threshold resistance value Rth.

When partial shading or a change in the color of a filler occur in all units of calculation, the solar radiation amounts p1 to pn for each unit of calculation are equal to each other and there is a concern that the failure will not be determined to be partial shading or a change in the color of a filler. Therefore, the solar radiation amount acquired by the external environment measurement unit 104 is input to the comparison unit 3 and the comparison unit 3 compares the input solar radiation amount with the solar radiation amounts p1 to pn for each unit of calculation. When the solar radiation amounts p1 to pn for each unit of calculation are equal to each other, but are less than the solar radiation amount acquired by the external environment measurement unit 104, it can be determined that partial shading or a change in the color of a filler occurs in all units of calculation.

Example 2

Figure 11:
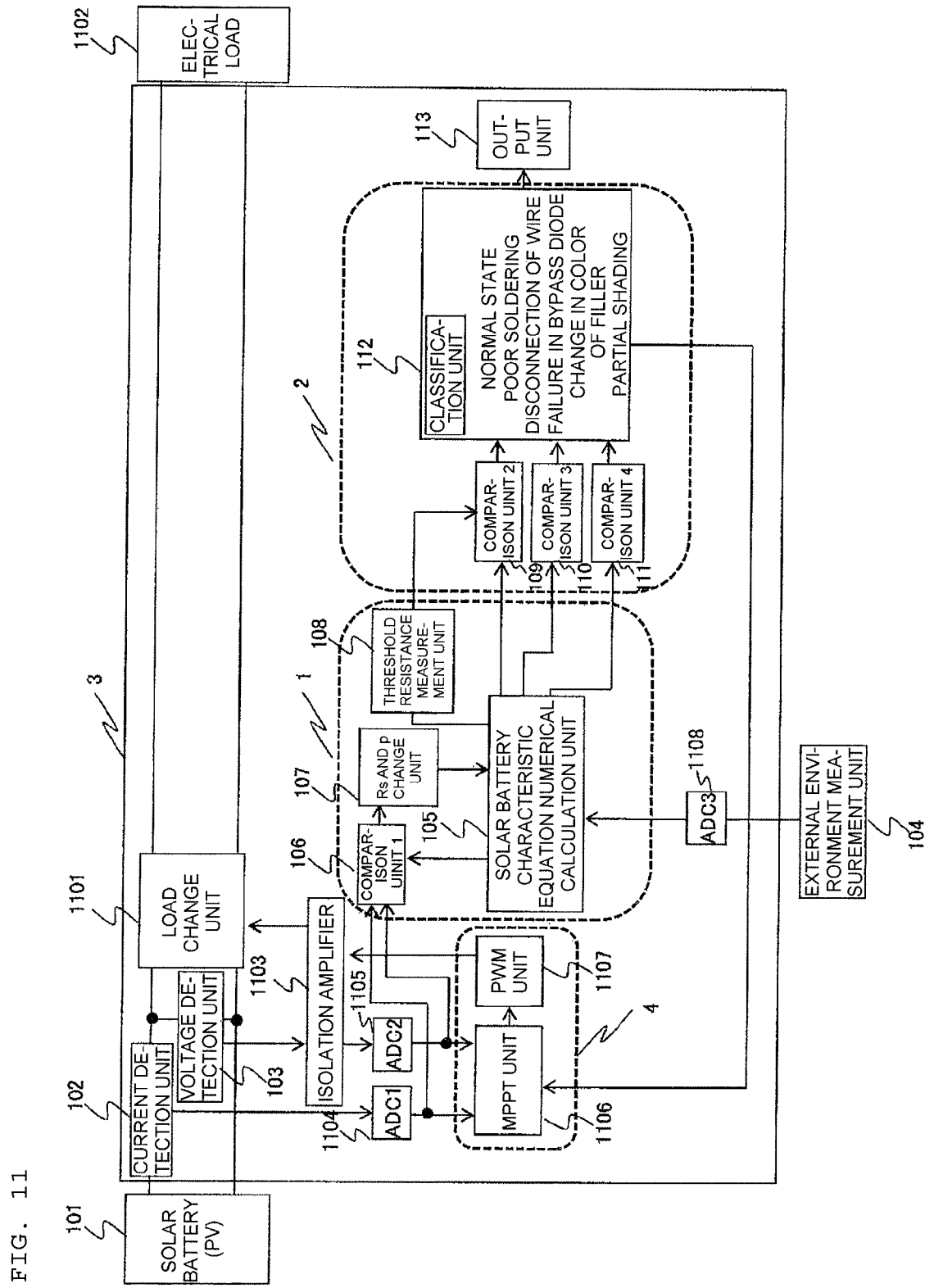
FIG. 11 is a block diagram illustrating an example of the structure of a solar power generation system according to Example 2.

FIG. 11 is a diagram illustrating the structure of a solar power generation system according to Example 2. The solar power generation system shown in FIG. 11 includes a solar battery, a power conditioner (PCS), and an electrical load and the abnormality detection system according to Example 1 is applied to the solar power generation system. The same components as those in FIG. 1 are denoted by the same reference numerals and the description thereof will not be repeated.

Since the solar battery outputs a DC voltage, the solar power generation system is connected to a commercial power supply through a DC/AC inverter circuit. In the solar power generation system, an inverter circuit and the commercial power supply can be considered to function as an electrical load 1102.

In the power conditioner (PCS) 3, a current detection unit 102 and a voltage detection unit 103 detect the operating voltage value and the operating current value of the solar battery, respectively. The detected voltage value is input to an AD converter ADC2 (1105) through an isolation amplifier 1103, is converted into a digital value, and is then input to a maximum power point tracking unit 4. In addition, the detected current value is input to an AD converter ADC1 (1104), is converted into a digital value, and is then input to the maximum power point tracking unit 4.

The maximum power tracking unit 4 includes an MPPT unit 1106 and a pulse width modulation unit (PWM unit 1107). The MPPT unit 1106 determines whether to increase or decrease the voltage and current values in order to track the maximum power point using the detected current value or voltage value, and generates a control signal. The PWM unit 1107 performs pulse width modulation for transmitting the control signal to a load change unit 1101. The signal from the PWM unit 1107 is input to the load change unit 1101 through an isolation amplifier 1103. The load change unit 1101 changes a load for the solar battery on the basis of the PWM signal, controls a voltage or a current to be output, and makes the solar battery generate power at the optimal operating point. Specifically, the load change unit 1101 is provided with a DC-DC converter including a switching element and controls the conduction ratio of the turning-on and turning-off of the switching element in a switching operation with the PWM signal to make the solar battery generate power at the optimal operating point.

The operating voltage and the operating current value detected by the current detection unit 102 and the voltage detection unit 103 are also input to the characteristic calculation unit 1. In addition, external environment data acquired by the external environment measurement unit 104 is input to an AD converter ADC3 (1108), is converted into a digital value, and is then input to the characteristic calculation unit 1. The calculation result of the characteristic calculation unit 1 is input to the abnormality detection unit 2. The classification result is fed back to the maximum power point tracking unit 4 at the same time as it is input to an output unit. The maximum power point tracking unit 4 outputs a control signal on the basis of the classification result. It is possible to know local power loss due to, for example, partial shading using this feedback loop. Therefore, the MPPT unit can search for the maximum power again on the basis of the feedback signal. That is, the tracking performance of the maximum power point is improved.

The invention made by the inventors has been described in detail with reference to the embodiments. However, the invention is not limited to the embodiments, but various modifications and changes of the invention can be made without departing from the scope and spirit of the invention. For example, the invention is effective in detecting and classifying a failure or partial shading of a crystalline solar battery, but can accurately detect and classify a failure and partial shading in different types of solar batteries, such as a thin film solar battery, by changing parameters of an equivalent circuit which performs modeling or determination.

REFERENCE SIGNS LIST

1: CHARACTERISTIC CALCULATION UNIT
2: ABNORMALITY DETECTION UNIT
3: POWER CONDITIONER (PCS)
4: MAXIMUM POWER POINT TRACKING UNIT
10: SOLAR BATTERY CELL
11: SOLAR BATTERY CLUSTER
12: SOLAR BATTERY MODULE
13: BYPASS DIODE
14: DC CURRENT SOURCE
15: DIODE
16: SHUNT RESISTANCE VALUE
17: SERIES RESISTANCE VALUE
101: SOLAR BATTERY (PV)
102: CURRENT DETECTION UNIT
103: VOLTAGE DETECTION UNIT
104: EXTERNAL ENVIRONMENT MEASUREMENT UNIT
105: SOLAR BATTERY CHARACTERISTIC EQUATION NUMERICAL CALCULATION UNIT
106: COMPARISON UNIT 1
107: SERIES RESISTANCE VALUE AND SOLAR RADIATION AMOUNT CHANGE UNIT
108: THRESHOLD RESISTANCE CALCULATION UNIT
109: COMPARISON UNIT 2
110: COMPARISON UNIT 3
111: COMPARISON UNIT 4
112: CLASSIFICATION UNIT
113: OUTPUT UNIT

The invention claimed is:

1. A solar power generation system comprising:
a solar battery including solar battery cells which are connected in series to each other;
a voltage detection unit that detects an output voltage value of the solar battery during electric power generation of the solar battery cells which receive rays of sun light and cause photoelectric conversion;
a current detection unit that detects an output current value of the solar battery during the electric power generation;
an external environment measurement unit that acquires a temperature of the solar battery cells and an amount of solar radiation;
a characteristic calculation unit that calculates characteristics of the solar battery in a failure or partial shading state and a threshold value for detecting the failure or partial shading state, using the output voltage value, the output current value, the temperature of the solar battery cells and an amount of solar radiation data; and
an abnormality detection unit that detects the failure or partial shading state of the solar battery, using the characteristics of the solar battery in the failure or partial shading state and the threshold value;
wherein the characteristic calculation unit calculates a series resistance value, an amount of solar radiation, a minimum value of a reverse bias voltage, and a threshold resistance value for detecting the failure or partial shading state for each unit of calculation in which a predetermined number of solar battery cells are connected in series to each other;
wherein the characteristic calculation unit calculates current-voltage characteristics in a normal state, which means without causing the failure or partial shading state for each unit of calculation, using the external environment data, and calculates a first threshold resistance value for detecting a disconnection of a wire and a second threshold resistance value for detecting poor soldering, using the current-voltage characteristics in the normal state;
wherein the abnormality detection unit determines that poor soldering occurs when the series resistance value is greater than the second threshold resistance value and is less than the first threshold resistance value, and determines that the disconnection of the wire occurs when the series resistance value is greater than the first threshold resistance value; and
wherein the first threshold resistance value, Rth1, is determined based on expression (3), and the second threshold resistance value, Rth2, is determined based on expression (8)

$$Rth1 = \frac{\ln((Isc \cdot p - Iopo)/IS)}{\frac{q/(nf \cdot k \cdot T \cdot Ncell)}{Iopo}} \tag{3}$$

$$P_{loss} = \frac{m}{n} - \frac{I_E^2}{Iopo^2} \cdot \frac{m}{n} \cdot \left(1 - \frac{Rs}{Rth1}\right)(Rs < R_{th1}) \tag{8}$$

$$P_{loss} = \frac{m}{n}(R_{th1} \leq Rs)$$

where ln is a natural logarithm, Isc is a short-circuit current, p is the amount of solar radiation, Iopo is an operating current, Is is a reverse saturation current of a solar battery cell, q is a quantity of electric charge, k is a Boltzmann constant, T is an absolute temperature, Ncell is a number of solar cells, $P_{loss}$ is an amount of power loss, m is a number of defective clusters, n is a total number of clusters, $I_E$ is an operating current of a defective solar battery, Rs is the series resistance value, and the expression (8) is solved in terms of the series resistance value Rs to calculate the second threshold resistance value Rth2.

* * * * *